(12) United States Patent
Sakajiri et al.

(10) Patent No.: US 9,684,098 B2
(45) Date of Patent: Jun. 20, 2017

(54) ANTIGLARE HARD COAT FILM

(71) Applicant: NIPPON PAPER INDUSTRIES CO., LTD., Kita-ku, Tokyo (JP)

(72) Inventors: Kimiyoshi Sakajiri, Higashimatsuyama (JP); Takeshi Hotta, Higashimatsuyama (JP); Takeo Suzuki, Higashimatsuyama (JP); Yusuke Sugiyama, Higashimatsuyama (JP); Syou Kariatumari, Higashimatsuyama (JP)

(73) Assignee: Nippon Paper Industries Co., Ltd., Kita-ku, Tokyo (JP)

( * ) Notice: Subject to any disclaimer, the term of this patent is extended or adjusted under 35 U.S.C. 154(b) by 0 days.

(21) Appl. No.: 14/347,472

(22) PCT Filed: Sep. 26, 2012

(86) PCT No.: PCT/JP2012/074810
§ 371 (c)(1),
(2) Date: Mar. 26, 2014

(87) PCT Pub. No.: WO2013/047626
PCT Pub. Date: Apr. 4, 2013

(65) Prior Publication Data
US 2014/0254020 A1    Sep. 11, 2014

(30) Foreign Application Priority Data

Sep. 27, 2011    (JP) .................................. 2011-210251

(51) Int. Cl.
*G02B 1/11*    (2015.01)
*G02B 1/10*    (2015.01)
(Continued)

(52) U.S. Cl.
CPC ................ *G02B 1/11* (2013.01); *G02B 1/105* (2013.01); *G02B 5/02* (2013.01); *G02B 5/0226* (2013.01);
(Continued)

(58) Field of Classification Search
CPC . G02B 1/10; G02B 1/105; G02B 1/11; G02B 5/02; G02B 5/0226; G02B 5/0242; G02B 5/0278; H01L 51/5281; G09F 9/00
See application file for complete search history.

(56) References Cited

FOREIGN PATENT DOCUMENTS

JP    2008-180852 A    8/2008
JP    2008-281596 A    11/2008
(Continued)

OTHER PUBLICATIONS

Masayuki et al., JP 2008-180852, Aug. 7, 2008, English Machine Translation created Sep. 24, 2015.*
(Continued)

*Primary Examiner* — Derek S Chapel
*Assistant Examiner* — Adam W Booher
(74) *Attorney, Agent, or Firm* — Sughrue Mion, PLLC

(57) ABSTRACT

An antiglare hard coat film formed by providing an antiglare hard coat layer containing fine particles and a resin on a transparent film. When an average value of height in an evaluation region on a surface of the antiglare hard coat film is set at zero (0), a maximum cross sectional height represented by a difference between a height maximum value in the evaluation region and a height minimum value in the evaluation region is from 1.0 to 3.0 μm, and an average inclination angle of unevenness on the surface of the antiglare hard coat film is 1 degree or less. The total value of the transmissive clarity measured through four optical combs using a transmissive clarity measuring device according to JIS K 7105-1981 is 280% or more, and the value of the transmissive clarity measured through each optical comb is 70% or more, respectively.

13 Claims, 1 Drawing Sheet

(51) Int. Cl.
    *G02B 5/02*     (2006.01)
    *H01L 51/52*     (2006.01)

(52) U.S. Cl.
    CPC ......... *G02B 5/0242* (2013.01); *G02B 5/0278* (2013.01); *H01L 51/5281* (2013.01)

(56) References Cited

FOREIGN PATENT DOCUMENTS

| | | |
|---|---|---|
| JP | 2010-256850 A | 11/2010 |
| JP | 2010-256851 A | 11/2010 |
| WO | 2010/113827 A1 | 10/2010 |

OTHER PUBLICATIONS

Takeshi et al., JP 2010-256850, Nov. 11, 2010, English Machine Translation created Sep. 24, 2015.*
Hotta et al., WO 2010/113827, English Language Machine Translation, created Jun. 29, 2016.*
Notification of Reasons for Refusal in corresponding Japanese Application No. 2012-061297 dated Mar. 4, 2013.
Office Action issued in corresponding Chinese Patent Application No. 201280047423.8 dated Nov. 16, 2015.

* cited by examiner

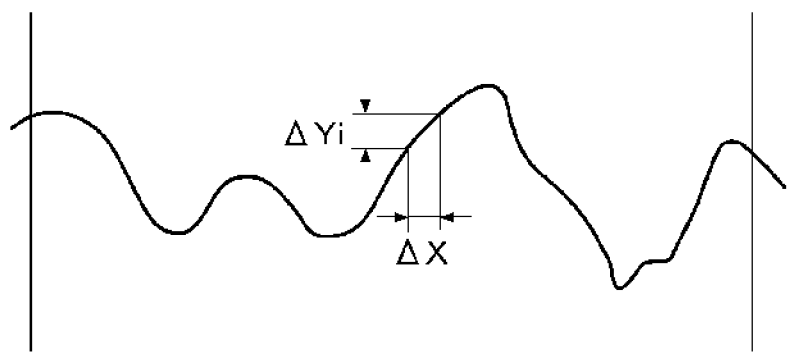

ANTIGLARE HARD COAT FILM

CROSS REFERENCE TO RELATED APPLICATIONS

This application is a National Stage of International Application No. PCT/JP2012/074810 filed Sep. 26, 2012, claiming priority based on Japanese Patent Application No. 2011-210251 filed Sep. 27, 2011, the contents of all of which are incorporated herein by reference in their entirety.

TECHNICAL FIELD

The present invention relates to an antiglare hard coat film which is suitable for preventing deterioration of visibility used on a surface of various displays typified by a liquid crystal display, a plasma display, and an organic EL display.

BACKGROUND ART

In displays of notebook PCs, liquid crystal monitors and the like, in order to prevent reflection of the outside scenery on a surface of displays, a mixture of organic or inorganic fine particles and a binder resin or a curable resin is usually applied on a base material to form unevenness on the surface, thus exhibiting antiglare properties. In order to improve antiglare properties, there is a need to increase the shape of unevenness or to increase frequency of unevenness. Large unevenness or an increase in frequency of unevenness enables an increase in haze value (haze degree) of an antiglare layer, thus obtaining antiglare properties. However, there arose a problem that reflection of external light may cause white blur of a screen and an increase in haze value may cause deterioration of image clarity, leading to deterioration of visibility of a display image. Moreover, if the haze value on the surface, which is a general evaluation of a conventional antiglare hard coat film, is lowered, though the degree of white blur of the screen caused by reflection of the external light can be suppressed, glaring brightness referred to as so-called scintillation (glare) becomes strong on the film surface. In order to solve this, a method of increasing the haze value inside the antiglare layer has been used. However, light transmittance is lowered by internal haze caused by a refractive index difference between the fine particles and the resin, which lowers display brightness of the display device, and a coated film becomes whitish due to the internal haze at the same time, thus causing drastic deterioration of contrast.

Japanese Unexamined Patent Application Publication No. 11-326608 (Patent Document 1) discloses an antiglare film in which translucent fine particles having an average particle size of 0.5 to 5.0 μm and a refractive index difference between translucent fine particles and a light transmissive resin of 0.02 to 0.20 are mixed. Patent Document 1 discloses that control of a refractive index difference between a light transmissive resin, which forms the antiglare layer, and translucent fine particles contained therein within a range from 0.02 to 0.20 enables an improvement in image clarity without lowering diffusion/antiglare properties, and also enables maintenance of high image clarity even if the haze value is increased to reduce glaring. However, the specifically obtained film has high antiglare properties with the haze of 10% or more, while the coated film becomes whitish, leading to drastic deterioration of the light transmittance and contrast.

Japanese Unexamined Patent Application Publication No. 2008-286878 (Patent Document 2) discloses as follows. That is, in an antiglare film, since a refractive index difference between a cured material of a binder and translucent fine particles is controlled within a small range from 0 to 0.05, light transmittance inside an antiglare hard coat layer can be improved. Since an arithmetic average roughness (Ra) measured in accordance with JIS B 0601-1994 is controlled within a range from 0.01 to 0.30 μm and an average interval (Sm) of unevenness is controlled within a small range from 10 to 300 μm on the surface of the antiglare hard coat layer, light transmittance can be maintained while exerting light diffusion on the surface (outer face) of the antiglare hard coat layer, and thus the antiglare hard coat layer can exert suppression of glaring and improvement in transmissive clarity in a well-balanced manner. However, the ranges of the arithmetic average roughness (Ra) of 0.01 to 0.30 μm and the average interval (Sm) of unevenness of 10 to 300 μm are not small, and most of the antiglare films formed into a product in the market at present fall within this range. Regarding the specifically obtained film having an arithmetic average roughness (Ra) of 0.1 μm or more, if the value of image clarity measured by an optical comb having a width of 2 mm is less than 70%, and the value of image clarity measured at reflection of 60-degree is 60% or less, antiglare properties may be ensured. However, there remains a problems that glare on a high-definition panel is not sufficiently prevented and a consideration is not made on whitishness of a coating film, leading to drastic deterioration of light transmittance and contrast.

CITATION LIST

Patent Literature

Patent Document 1:
Japanese Unexamined Patent Application Publication No. 11-326608
Patent Document 2:
Japanese Unexamined Patent Application Publication No. 2008-286878

SUMMARY OF INVENTION

Technical Problem

The prior art had the following problems. That is, too much emphasis is placed on the antiglare properties to increase the haze value in view of prevention of glare and to sufficiently increase image clarity, thus failing to solve low light transmittance and whitishness. When an image is displayed, the screen becomes whitish, and particularly image quality deteriorates in black display.

An object of the present invention is to provide an antiglare hard coat film for surface protection, which enables high transparency, low haze value, excellent transparency, high image clarity, suppression of glare of an image, reduction of whitishness (white blur) of a coating film, suppression of deterioration of contrast, and improvement in visibility of a display, without imparting antiglare properties more than necessary, as compared with such a conventional antiglare film.

Solution to Problem

The present inventors have intensively studied so as to achieve the above object and found that the above problems can be solved by an antiglare hard coat film formed by providing an antiglare hard coat layer containing fine particles and a resin on a transparent film, wherein when an average value of height in an evaluation region on a surface of the antiglare hard coat film is set at zero (0), a maximum cross sectional height represented by a difference between a height maximum value in the evaluation region and a height minimum value in the evaluation region is from 1.0 to 3.0 µm, and an average inclination angle of unevenness on the surface of the antiglare hard coat film is 1 degree or less. According to the present invention, since an antiglare hard coat film having a low haze value, high light transmittance and excellent transparency can be obtained, glare of an image can be suppressed, and visibility of a display can be improved. In the antiglare hard coat film of the present invention, the total value of transmissive clarity measured through four optical combs (each measuring 2 mm in width, 1 mm, 0.5 mm, and 0.125 mm) using a transmissive clarity measuring device according to JIS K 7105-1981 is 280% or more, and the value of the transmissive clarity measured through each optical comb is 70% or more, respectively, whereby, image clarity is increased, whitishness (white blur) of the coating film is reduced, deterioration of contrast is suppressed, and visibility of the display can be improved.

In the antiglare hard coat film of the present invention, it is preferred that the fine particles have an average particle size of 1.0 to 4.8 µm, and the coating film thickness of the antiglare hard coat layer is 0.5 to 1.5 times larger than the average particle size of the fine particles. It is more preferred that the fine particles have an average particle size of 3.0 to 4.8 µm.

In the present invention, it is preferred that the amount of the fine particles mixed is from 0.05 to 3 parts by weight based on 100 parts by weight of the resin.

The haze value of the antiglare hard coat film is from 0.1 to 5.0%, 60-degree specular glossiness is 70% or more and 95% or less, 20-degree specular glossiness is 30% or more and 90% or less, and luminous transmittance (transmission Y value) is 92.00 or more, whereby, it is possible to further exert the effects of the present invention.

An ionizing radiation curable resin having general versatility is preferably used as the resin contained in the antiglare hard coat layer in view of inexpensive mass production.

For example, a triacetyl cellulose film, a polyethylene terephthalate film, a norbornene film or the like is suitably used as a transparent film used in the present invention from the viewpoint of high visibility or price.

Advantageous Effects of Invention

According to the present invention, it is possible to provide an antiglare hard coat film for surface protection, which enables high transparency, low haze value, high transparency, high image clarity, suppression of glare of an image, reduction of whitishness (white blur) of a coating film, suppression of deterioration of contrast, and improvement in visibility of a display, without imparting antiglare properties more than necessary, as compared with such a conventional antiglare film. That is, the antiglare hard coat film of the present invention enables reduction of whitishness of a coating film, and antiglare properties of the level causing no problem in practical use as well as highlight transmittance and high image clarity without causing deterioration of contrast, and also enables suppression of glare of images and improvement in visibility of a display.

BRIEF DESCRIPTION OF THE DRAWINGS

FIG. 1 is a reference drawing for describing how to determine an average inclination angle of a film surface.

DESCRIPTION OF EMBODIMENTS

Embodiments of the present invention will be described in detail below.

The antiglare hard coat film of the present invention is an antiglare hard coat film formed by providing an antiglare hard coat layer containing fine particles and a resin on a transparent film, wherein when an average value of height in an evaluation region on a surface of the antiglare hard coat film is set at zero (0), a maximum cross sectional height represented by a difference between a height maximum value in the evaluation region and a height minimum value in the evaluation region is from 1.0 to 3.0 µm, and an average inclination angle of unevenness on the surface of the antiglare hard coat film is 1 degree or less.

As used herein, "maximum cross sectional height" is as defined above and, as defined in JIS B0601, it is a value calculated from a cross sectional curve (measurement curve) of a film surface as a measuring target. On a surface of an antiglare hard coat film provided with an antiglare hard coat layer containing fine particles and a resin, like the present invention, not only fine uneven shape but also waviness exists. The measurement curve (usually also referred to as a cross sectional curve) obtained by measuring using a surface roughness meter has the following relation with a waviness curve and a roughness curve.

Cross sectional curve=waviness curve+roughness curve

Therefore, "maximum cross sectional height" in the present invention evaluates a cross sectional curve containing a "surface waviness component". In JIS 2001, the maximum cross sectional height is represented by the symbol "Pt".

The above-mentioned "average inclination angle" refers to an angle which is obtained by dividing a cross sectional curve (measurement curve) of a film surface as a measuring target at a certain interval $\Delta X$ in a lateral direction, determining the absolute value of an inclination (inclination angle: inclination angle is determined by $\tan^{-1}(\Delta Yi/\Delta X)$) of line segment connecting tangent points of the cross sectional curve in each section, and averaging the value (see FIG. 1). That is, an average inclination angle ($\theta a$) is a value defined by the following equation.

$$\theta a = \frac{1}{n-1} \sum_{i=1}^{n-1} \left\{ \tan^{-1} \left| \left( \frac{\Delta Yi}{\Delta X} \right) \right| \right\} \quad [\text{Math. 1}]$$

According to the present inventors' examination, the reason why such antiglare hard coat film of the present invention has low haze value, high light transmittance and excellent transparency is assumed as follows.

The haze value of the antiglare hard coat film includes surface haze generated by refraction and scattering of light caused by unevenness on the surface of an antiglare hard coat layer, and internal haze generated by refraction and scattering of light caused by presence of fine particles in the antiglare hard coat layer. When an average value of height in an evaluation region on a surface of the antiglare hard coat film is set at zero (0), if the maximum cross sectional height represented by a difference between the height maximum value in the evaluation region and the height minimum value in the evaluation region is from 1.0 to 3.0 µm, and also an average inclination angle of unevenness of the surface of the antiglare hard coat film is 1 degree or less, surface properties such as waviness in a specific region or smooth (gentle)

surface unevenness are obtained, and refraction and scattering of light caused by unevenness on the surface can be suppressed. Therefore, the surface haze becomes less likely to appear, and light loss caused by light refraction and scattering can be suppressed. Accordingly, deterioration in light transmittance can be suppressed and also a phenomenon that the antiglare hard coat film blurs in white due to scattered light on the surface of the antiglare hard coat layer is suppressed, thus considering that excellent transparency is achieved.

If the maximum cross sectional height of the surface of the antiglare hard coat film exceeds 3.0 μm, refraction and scattering of light caused by unevenness on the surface may be intensified, the surface haze is likely to appear, and deterioration of light transmittance may be caused by light loss due to light refraction and scattering and also antiglare properties by scattered light on the surface of the antiglare hard coat layer is likely to be obtained. However, since the phenomenon that the antiglare hard coat film is blurred in white becomes less likely to be suppressed, transparency and transmissive clarity are likely to deteriorate.

There is no particular limitation on the lower limit of the maximum cross sectional height and, if the maximum cross sectional height is less than 1.0 μm, antiglare properties by scattered light on the surface of the antiglare hard coat layer may become less likely to be obtained since unevenness on the film surface becomes too small.

If the average inclination angle is more than 1 degree (exceeding 1 degree), refraction and scattering of light caused by unevenness on the surface may be intensified, the surface haze is likely to appear, and deterioration of light transmittance may be caused by light loss due to light refraction and scattering and also antiglare properties by scattered light on the surface of the antiglare hard coat layer is likely to be obtained. However, since the phenomenon that the antiglare hard coat film is blurred in white becomes less likely to be suppressed, there arise a problem that transparency and transmissive clarity are likely to deteriorate.

Therefore, in the present invention, the maximum cross sectional height of the surface of the antiglare hard coat film is preferably 1.0 μm or more and 3.0 μm or less, and more preferably 1.2 μm or more and 2.5 μm or less.

The average inclination angle of the antiglare hard coat film is preferably 1 degree or less, more preferably 0.9 degree, and still more preferably 0.7 degree or less. There is no particular limitation on the lower limit of the average inclination angle, and the lower limit is preferably 0.1 degree or more in view of antiglare properties.

In the present invention, "evaluation region" means a measurement region.

In the antiglare hard coat film of the present invention, the total value of transmissive clarity measured through four optical combs (each measuring 2 mm in width, 1 mm, 0.5 mm, and 0.125 mm) using a transmissive clarity measuring device according to JIS K 7105-1981 is 280% or more, and the value of the transmissive clarity measured through each optical comb is 70% or more, respectively, whereby, image clarity is increased, whitishness (white blur) of the coating film is reduced, deterioration of contrast is suppressed, and visibility of the display can be improved.

There is no particular limitation on a transparent film usable in the present invention, and it is possible to use, for example, a polyethylene terephthalate film (PET: refractive index of 1.665), a polycarbonate film (PC: refractive index of 1.582), a triacetyl cellulose film (TAC: refractive index of 1.485), a norbornene film (NB: refractive index of 1.525) and the like. There is also no particular limitation on film thickness, and a film thickness of approximately 25 μm to 250 μm is widely used. Since the refractive index of a general ionizing radiation curable resin is approximately 1.52, a TAC film or an NB film having the refractive index close to the resin is preferable so as to improve visibility, and a PET film is preferable in view of the price.

There is no particular limitation on the resin usable in the present invention as long as it is a resin which forms a coating film. An ionizing radiation curable resin is preferable from the viewpoint that hardness (pencil hardness, abrasion resistance) is imparted to the surface of the antiglare hard coat layer and a large amount of heat is not required during formation of the antiglare hard coat layer. The antiglare hard coat layer may optionally contain a leveling agent, an antifoaming agent, a lubricant, an ultraviolet absorber, a light stabilizer, a polymerization inhibitor, a moist dispersing agent, a rheology control agent, an antioxidant, an antifouling agent, an antistatic agent, a conductant agent and the like within a range not changing the effects of the present invention There is no particular limitation on the ionizing radiation curable resin as long as it is a transparent resin which is curable by irradiation with electron beams, ultraviolet rays or the like and can be appropriately selected from a urethane acrylate-based resin, a polyester acrylate-based resin, an epoxy acrylate-based resin and the like. Preferable ionizing radiation curable resin includes an ultraviolet curable polyfunctional acrylate having two or more (meth)acryloyl groups in a molecule. Specific examples of the ultraviolet curable polyfunctional acrylate having two or more (meth) acryloyl groups in a molecule include polyol polyacrylates such as neopentyl glycol di(meth)acrylate, 1,6-hexanediol di(meth)acrylate, trimethylolpropane tri(meth)acrylate, ditrimethylolpropane tetra(meth)acrylate, pentaerythritol tetra(meth)acrylate, pentaerythritol tri(meth)acrylate, dipentaerythritol hexa(meth)acrylate and the like; epoxy (meth) acrylate such as diacrylate of bisphenol A diglycidyl ether, diacrylate of neopentyl glycol diglycidyl ether, di(meth) acrylate of 1,6-hexanediol diglycidyl ether and the like; polyester (meth)acrylates obtained by esterifying polyhydric alcohol and polyhydric carboxylic acid and/or anhydride and acrylic acid thereof; urethane (meth)acrylate obtained by reacting polyhydric alcohol, polyhydric isocyanate, and hydroxyl group-containing (meth)acrylate, polysiloxane poly(meth)acrylate and the like.

The ultraviolet curable polyfunctional acrylates may be used alone, or two or more kinds of ultraviolet curable polyfunctional acrylates may be used in combination, and the content is preferably from 50 to 95% by weight based on the resin solid content of the coating material for antiglare hard coat layer. It is also possible to add, in addition to the above-mentioned polyfunctional (meth)acrylates, monofunctional acrylates such as 2-hydroxy (meth)acrylate, 2-hydroxypropyl (meth)acrylate and glycidyl (meth)acrylate in the amount of preferably 10% by weight or less based on the resin solid content of the coating material for antiglare hard coat layer.

It is also possible to add a polymerizable oligomer, which is used to adjust hardness, to an antiglare hard coat layer. Examples of such oligomer include macro monomers such as terminal (meth)acrylate polymethyl (meth)acrylate, terminal styryl poly(meth)acrylate, terminal (meth)acrylate polystyrene, terminal (meth)acrylate polyethylene glycol, terminal (meth)acrylate acrylonitrile-styrene copolymer, terminal (meth)acrylate styrene-methyl methacrylate copolymer and the like, and the content is preferably from 5 to 50% by weight based on the resin solid content in the coating material for antiglare hard coat layer.

Examples of the material forming fine particles used in the present invention include, but are not limited to, silica (refractive index of 1.420 to 1.460), a vinyl chloride resin (refractive index of 1.530), an acrylic resin (refractive index of 1.490), a (meth)acrylic resin (refractive index of 1.520 to 1.530), a polystyrene resin (refractive index of 1.590), a melamine resin (refractive index of 1.650), a polyethylene resin, a polycarbonate resin, an acryl-styrene copolymer resin (refractive index of 1.490 to 1.590) and the like. Fine particles may be used alone, or two or more kinds of fine particles can be used in combination. There is also no particular limitation on the refractive index of the fine particles. In order to obtain further effects of the present invention, fine particles to be used are preferably fine particles in which a difference in a refractive index between fine particles and a resin used in an antiglare hard coat layer is from 0.001 to 0.200, and more preferably fine particles in which a difference in a refractive index is from 0.001 to 0.100.

In the present invention, the coating film thickness of the antiglare hard coat layer is preferably from 0.5 to 1.5 times, and more preferably 0.8 to 1.2 times, larger than the average particle size of fine particles which form an antiglare hard coat layer. The average particle size of fine particles is preferably from 1.0 to 4.8 μm, and more preferably from 3.0 to 4.8 μm so as to impart high pencil hardness.

If the coating film thickness is less than 0.5 time larger than the average particle size of the fine particles which form an antiglare hard coat layer, fine particles may not be fixed in a coating film, leading to drastic poor hardness of a surface of a coating film.

On the other hand, if the coating film thickness exceeds 1.5 times larger than the average particle size of fine particles which form an antiglare hard coat layer, it may become impossible to obtain antiglare properties. The average particle size of fine particles can be measured by, for example, a laser diffraction-scattering method.

If the average particle size of fine particles is more than 4.8 μm, antiglare properties more than necessary are imparted when the coating film thickness of the antiglare hard coat layer is set within a range of 0.5 to 1.5 times larger than the average particle size of the fine particles, which increases scattering of external light on the surface of the costing film and makes the surface whitish by scattering of the light, leading to drastic deterioration of visibility of the display. On the other hand, if the average particle size is less than 1.0 μm, the coating film thickness must be reduced, leading to lack of hardness.

In the present invention, fine particles are preferably mixed in the antiglare hard coat layer in the amount of 0.05 to 3 parts by weight, more preferably 0.075 to 1 part by weight, and still more preferably 0.1 to 0.5 part by weight, based on 100 parts by weight of the resin.

If the mixed amount of the fine particles is less than 0.05 part by weight based on 100 parts by weight of the resin, when the coating film thickness of the antiglare hard coat layer is set at 0.5 to 1.5 times larger than the average particle size of fine particles, no antiglare properties can be obtained at all. If the mixed amount of the fine particles exceeds 3 parts by weight based on 100 parts by weight of the resin, the haze value may increase, leading to deterioration of light transmittance and contrast.

As mentioned above, the antiglare hard coat film of the present invention is an antiglare hard coat film formed by providing an antiglare hard coat layer containing fine particles and a resin on a transparent film, wherein when an average value of height in an evaluation region on a surface of the antiglare hard coat film is set at zero (0), a maximum cross sectional height represented by a difference between a height maximum value in the evaluation region and a height minimum value in the evaluation region is from 1.0 to 3.0 μm, and an average inclination angle of unevenness on the surface of the antiglare hard coat film is 1 degree or less, and wherein the total value of transmissive clarity measured through four optical combs (each measuring 2 mm in width, 1 mm, 0.5 mm, and 0.125 mm) using a transmissive clarity measuring device according to JIS K 7105-1981 is 280% or more, and the value of the transmissive clarity measured through each optical comb is 70% or more, respectively. In this case, it is preferred that the fine particles have an average particle size of 1.0 to 4.8 μm, and the coating film thickness of the antiglare hard coat layer is preferably from 0.5 to 1.5 times larger than the average particle size of the fine particles, and the amount of the fine particles mixed is from 0.05 to 3 parts by weight based on 100 parts by weight of the resin. The haze value of the antiglare hard coat film is preferably from 0.1 to 5.0%, more preferably from 0.1 to 3.5%, and still more preferably from 0.1 to 2.0%.

The antiglare hard coat layer can be formed by applying coating obtained by dissolving and dispersing the resin, fine particles and the like in a solvent on a transparent film, followed by drying. The solvent can be appropriately selected in accordance with solubility of the resin and at least a solid component (resin, fine particles, catalyst, curing agent, and other additives) can be dissolved or dispersed uniformly. Examples of such solvent include ketones (acetone, methyl ethyl ketone, methyl isobutyl ketone, cyclohexanone, etc.), ethers (dioxane, tetrahydrofuran, etc.), aliphatic hydrocarbons (hexane, etc.), alicyclic hydrocarbons (cyclohexane, etc.), aromatic hydrocarbons (toluene, xylene, etc.), halogenated carbons (dichloromethane, dichloroethane, etc.), esters (methyl acetate, ethyl acetate, butyl acetate, etc.), alcohols (methanol, ethanol, isopropanol, butanol, cyclohexanol, etc.), cellosolves (methyl cellosolve, ethyl cellosolve, etc.), cellosolve acetates, sulfoxides, amides and the like. Solvents may be used alone or in combination.

There is no particular limitation on the coating method of the antiglare hard coat film, and coating can be performed by a method in which coating film thickness can be easily adjusted, such as a gravure coating method, a micro-gravure coating method, a bar coating method, a slide-die coating method, a slot-die coating method, or a dip coating method. The film thickness of the antiglare hard coat layer can be measured by observing a photograph of a cross section of an antiglare film using a microscope or the like, and actually measuring the thickness from the coating film interface to the surface.

In the antiglare hard coat film of the present invention, it is preferred that 60-degree specular glossiness is 70% or more and 95% or less and 20-degree specular glossiness is 30% or more and 90% or less, and also luminous transmittance (transmission Y value) is 92.00 or more.

In the antiglare hard coat film of the present invention, it is also possible to provide, in addition to an antiglare hard coat layer containing fine particles and a resin, functional layers such as an antireflection layer and an antistatic layer on a transparent film. However, when such a functional layer is provided, undulation on the surface may be cancelled, thus failing to obtain desired antiglare properties. Therefore, when a functional layer is provided on the antiglare hard coat layer containing fine particles, the film thickness of the functional layer is preferably set at 0.5 μm or less.

It is also possible to provide a functional layer below the antiglare hard coat layer. The functional layer includes, for example, a refractive index control layer which improves a reflection preventing function, an easy adhesion layer which imparts adhesion between a base material and the antiglare hard coat layer, an antistatic layer and the like.

In the antiglare hard coat film of the present invention, if a functional layer such as a reflection preventing layer or an antistatic layer is provided on the antiglare hard coat layer containing the fine particles other than the antiglare hard coat layer containing the fine particles and resin on the transparent film, when the coating film thickness of the antiglare hard coat layer is set at the average particle size or less of the fine particles forming the antiglare hard coat layer, the total coating film thickness of the antiglare hard coat layer and the functional layer needs to be 0.5 to 1.5 times larger than the average particle size of the fine particles forming the antiglare hard coat layer.

In the antiglare hard coat film of the present invention, if the functional layer such as a reflection preventing layer or an antistatic layer is provided on the antiglare hard coat layer containing fine particles and a resin on the transparent film, the maximum cross-sectional height represented by a difference between the height maximum value in the evaluation region and the height minimum value in the evaluation region, when the average value of the height in the evaluation region on the surface of the antiglare film, that is, on the surface of the functional layer is set at zero (0), must be from 1.0 to 3.0 μm, and an average inclination angle of unevenness of a surface of the functional layer must be 1 degree or less.

EXAMPLES

The present invention will be described below by way of Examples, but it is not intended to limit the present invention.

The average particle size of the fine particles was measured by a laser diffraction particle measuring device SALD-2200 (manufactured by Shimadzu Corporation). The coating film thickness was measured by observing a cross section using a scanning electron microscope manufactured by Keyence Corporation. Unless otherwise specified, "parts" and "%'s" mentioned below are "parts by weight" and "%'s by weight", respectively.

Example 1

<Preparation of Coating Material>
To 70.0 g of toluene, 0.09 g of acryl-styrene copolymer particles (manufactured by Sekisui Plastics Co., Ltd., average particle size of 2.0 μm, refractive index: 1.525) were added, followed by well stirring. To this solution, 27.45 g of an acrylic ultraviolet curable resin (manufactured by The Nippon Synthetic Chemical Industry Co., Ltd., refractive index: 1.52), 1.50 g of Irgacure 184 (photopolymerization initiator, manufactured by Ciba Specialty Chemicals Co., Ltd.) and 0.96 g of BYK 325 (leveling agent, manufactured by BYK Chemie Co., Ltd.) were added, followed by well stirring to prepare a coating material.
<Formation of Antiglare Film>
Fuji TAC (triacetyl cellulose film, manufactured by Fuji Film Corporation) was coated with the above coating material using a Meyer bar #4 (manufactured by RDS), dried at 80° C. for 1 minute and then cured by irradiating with ultraviolet rays of 350 mJ/cm² (light source: UV lamp manufactured by Fusion Japan). The thickness of the obtained coating film was 1.6 μm.

Example 2

<Preparation of Coating Material>
In the same manner as in Example 1, except that the acryl-styrene copolymer particles used in Example 1 were changed to melamine resin-silica composite particles (manufactured by Nissan Chemical Industries, Ltd., average particle size of 2.0 μm, refractive index of 1.650), a coating material was prepared.
<Formation of Antiglare Film>
In the same manner as in Example 1, an antiglare film was formed. The thickness of the obtained coating film was 1.6 μm.

Example 3

<Preparation of Coating Material>
To 80.00 g of toluene, 0.02 g of acryl fine particles (manufactured by Soken Chemical and Engineering Co., Ltd., average particle size of 1.5 μm, refractive index: 1.49) were added, followed by well stirring. To this solution, 18.02 g of an acrylic ultraviolet curable resin (manufactured by TOYO INK Manufacturing, Co., Ltd., refractive index: 1.49), 1.00 g of Irgacure 184 (photopolymerization initiator, manufactured by Ciba Specialty Chemicals Co., Ltd.) and 0.96 g of BYK 325 (leveling agent, manufactured by BYK Chemie Co., Ltd.) were added to prepare a coating material.
<Formation of Antiglare Film>
In the same manner as in Example 1, an antiglare film was formed. The thickness of the obtained coating film was 1.2 μm.

Example 4

<Preparation of Coating Material>
In the same manner as in Example 1, except that the acryl-styrene copolymer particles used in Example 1 were changed to particles having an average particle size of 3.0 μm (manufactured by Sekisui Plastics Co., Ltd., refractive index of 1.525), a coating material was prepared.
<Formation of Antiglare Film>
In the same manner as in Example 1, except that the Meyer bar used in Example 1 was changed to a Meyer bar #5, an antiglare film was formed. The thickness of the obtained coating film was 3.4 μm.

Example 5

<Preparation of Coating Material>
To 70.0 g of toluene, 0.75 g of acryl-styrene copolymer particles (manufactured by Sekisui Plastics Co., Ltd., average particle size of 2.0 μm, refractive index: 1.525) were added, followed by well stirring. To this solution, 26.79 g of an acrylic ultraviolet curable resin (manufactured by The Nippon Synthetic Chemical Industry Co., Ltd., refractive index: 1.52), 1.50 g of Irgacure 184 (photopolymerization initiator, manufactured by Ciba Specialty Chemicals Co., Ltd.) and 0.96 g of BYK 325 (leveling agent, manufactured by BYK Chemie Co., Ltd.) were added to prepare a coating material.
<Formation of Antiglare Film>
In the same manner as in Example 1, an antiglare film was formed. The thickness of the obtained coating film was 1.6 μm.

Example 6

<Preparation of Coating Material>

To 70.0 g of toluene, 0.02 g of acryl-styrene copolymer particles (manufactured by Sekisui Plastics Co., Ltd., average particle size of 2.0 μm, refractive index: 1.525) were added, followed by well stirring. To this solution, 27.52 g of an acrylic ultraviolet curable resin (manufactured by The Nippon Synthetic Chemical Industry Co., Ltd., refractive index: 1.52), 1.50 g of Irgacure 184 (photopolymerization initiator, manufactured by Ciba Specialty Chemicals Co., Ltd.) and 0.96 g of BYK 325 (leveling agent, manufactured by BYK Chemie Co., Ltd.) were added to prepare a coating material.

<Formation of Antiglare Film>

In the same manner as in Example 1, antiglare film was formed. The thickness of the obtained coating film was 1.6 μm.

Example 7

<Preparation of Coating Material>

To 45.0 g of toluene, 0.17 g of acryl-styrene copolymer particles (manufactured by Sekisui Plastics Co., Ltd., average particle size of 4.0 μm, refractive index: 1.525) were added, followed by well stirring. To this solution, 51.12 g of an acrylic ultraviolet curable resin (manufactured by The Nippon Synthetic Chemical Industry Co., Ltd., refractive index: 1.52), 2.75 g of Irgacure 184 (photopolymerization initiator, manufactured by Ciba Specialty Chemicals Co., Ltd.) and 0.96 g of BYK 325 (leveling agent, manufactured by BYK Chemie Co., Ltd.) were added to prepare a coating material.

<Formation of Antiglare Film>

In the same manner as in Example 1, an antiglare film was formed. The thickness of the obtained coating film was 3.6 μm.

Example 8

<Preparation of Coating Material>

To 65.0 g of butyl acetate, 0.18 g of acryl-styrene copolymer particles (manufactured by Sekisui Plastics Co., Ltd., average particle size of 3.3 μm, refractive index: 1.525) were added, followed by well stirring. To this solution, 32.50 g of an acrylic ultraviolet curable resin (manufactured by The Nippon Synthetic Chemical Industry Co., Ltd., refractive index: 1.52), 1.75 g of Irgacure 184 (photopolymerization initiator, manufactured by Ciba Specialty Chemicals Co., Ltd.) and 0.57 g of BYK 325 (leveling agent, manufactured by BYK Chemie Co., Ltd.) were added to prepare a coating material.

<Formation of Antiglare Film>

In the same manner as in Example 1, except that the Meyer bar used in Example 1 was changed to a Meyer bar #6, an antiglare film was formed. The thickness of the obtained coating film was 2.9 μm.

Example 9

<Preparation of Coating Material>

To 60.0 g of butyl acetate, 0.20 g of acryl-styrene copolymer particles (manufactured by Sekisui Plastics Co., Ltd., average particle size of 4.8 μm, refractive index: 1.525) were added, followed by well stirring. To this solution, 37.22 g of an acrylic ultraviolet curable resin (manufactured by The Nippon Synthetic Chemical Industry Co., Ltd., refractive index: 1.52), 2.00 g of Irgacure 184 (photopolymerization initiator, manufactured by Ciba Specialty Chemicals Co., Ltd.) and 0.58 g of BYK 325 (leveling agent, manufactured by BYK Chemie Co., Ltd.) were added to prepare a coating material.

<Formation of Antiglare Film>

In the same manner as in Example 1, except that the Meyer bar used in Example 1 was changed to a Meyer bar #8, an antiglare film was formed. The thickness of the obtained coating film was 4.3 μm.

Comparative Example 1

<Preparation of Coating Material>

To 82.00 g of toluene, 0.18 g of acryl-styrene copolymer particles (manufactured by Sekisui Plastics Co., Ltd., average particle size of 3.0 μm, refractive index: 1.525) were added, followed by well stirring. To this solution, 15.96 g of an acrylic ultraviolet curable resin (manufactured by The Nippon Synthetic Chemical Industry Co., Ltd., refractive index: 1.52), 0.90 g of Irgacure 184 (photopolymerization initiator, manufactured by Ciba Specialty Chemicals Co., Ltd.) and 0.96 g of BYK 325 (leveling agent, manufactured by BYK Chemie Co., Ltd.) were added to prepare a coating material.

<Formation of Antiglare Film>

In the same manner as in Example 1, an antiglare film was formed. The thickness of the obtained coating film was 1.2 μm.

Comparative Example 2

<Preparation of Coating Material>

To 52.5 g of toluene, 0.48 g of acryl-styrene copolymer particles (manufactured by Sekisui Plastics Co., Ltd., average particle size of 3.0 μm, refractive index of 1.525) were added, followed by well stirring. To this solution, 43.69 g of an acrylic ultraviolet curable resin (manufactured by The Nippon Synthetic Chemical Industry Co., Ltd., refractive index: 1.52), 2.38 g of Irgacure 184 (photopolymerization initiator, manufactured by Ciba Specialty Chemicals Co., Ltd.) and 0.96 g of BYK 325 (leveling agent, manufactured by BYK Chemie Co., Ltd.) were added to prepare a coating material.

<Formation of Antiglare Film>

In the same manner as in Example 1, except that the Meyer bar used in Example 1 was changed to a Meyer bar #6, an antiglare film was formed. The thickness of the obtained coating film was 6.9 μm.

Comparative Example 3

<Preparation of Coating Material>

To 70.0 g of toluene, 3.00 g of acryl-styrene fine particles (manufactured by Sekisui Plastics Co., Ltd., average particle size of 2.0 μm, refractive index: 1.525) were added, followed by well stirring. To this solution, 24.54 g of an acrylic ultraviolet curable resin (manufactured by The Nippon Synthetic Chemical Industry Co., Ltd., refractive index: 1.52), 1.50 g of Irgacure 184 (photopolymerization initiator, manufactured by Ciba Specialty Chemicals Co., Ltd.) and 0.96 g of BYK 325 (leveling agent, manufactured by BYK Chemie Co., Ltd.) were added to prepare a coating material.

<Formation of Antiglare Film>

In the same manner as in Example 1, an antiglare film was formed. The thickness of the obtained coating film was 1.8 μm.

Comparative Example 4

<Preparation of Coating Material>

To 60.0 g of toluene, 33.0 g of an acrylic ultraviolet curable resin (manufactured by The Nippon Synthetic Chemical Industry Co., Ltd., refractive index: 1.520), 1.50 g of Irgacure 184 (photopolymerization initiator, manufactured by Ciba Specialty Chemicals Co., Ltd.) and 0.50 g of BYK 325 (leveling agent, manufactured by BYK Chemie Co., Ltd.) were added to prepare a coating material.

<Formation of Antiglare Film>

In the same manner as in Example 1, an antiglare film was formed. The thickness of the obtained coating film was 3.4 μm.

Comparative Example 5

<Preparation of Coating Material>

In the same manner as in Example 1, except that the acryl-styrene copolymer particles used in Example 1 were changed to particles having an average particle size of 5.0 μm (manufactured by Sekisui Plastics Co., Ltd., refractive index of 1.525), a coating material was prepared.

<Formation of Antiglare Film>

In the same manner as in Example 1, except that the Meyer bar used in Example 1 was changed to a Meyer bar #10, an antiglare film was formed. The thickness of the obtained coating film was 5.6 μm.

The respective antiglare hard coat films of Examples and Comparative Examples formed as mentioned above were evaluated for the following items. The results are shown in below-mentioned Tables 1 and 2.

(1) Maximum Cross Sectional Height

Using a three-dimensional surface roughness meter "VertScan2.0" manufactured by Ryoka Systems Inc., the maximum cross sectional height was measured. The maximum cross sectional height (Pt) was determined from a difference between the height maximum value (P) in the evaluation region and the height minimum value (V) in the evaluation region when the average value (Ave) of the height in the evaluation region of a region roughness parameter obtained by the measurement is zero. The measurement conditions are as follows.

<Optical Conditions>
Camera: SONY HR-50 1/3 Model
Objective: 10× (10 power)
Tube: 1×Body
Relay: No Relay
Filter: 530 white
*Control of light quantity: Automatically performed so that the value of the lamp falls within the range of 50 to 95.
<Measurement Conditions>
Mode: Wave
Size: 640×480
Range (μm): Start (5), Stop (−10)

(2) Average Inclination Angle

Using a three-dimensional surface roughness meter "VertScan2.0" manufactured by Ryoka Systems Inc., an average inclination angle of the unevenness portion of a film surface was measured.

(3) Haze Value

Using a haze meter "HM150" manufactured by Murakami Color Research Laboratory Co., Ltds, measurement was made.

(4) Luminous Transmittance (transmission Y value)

Using "Integrating Sphere Fast Spectrophotometric Transmittance meter DOT-3" manufactured by Murakami Color Research Laboratory Co., Ltd., measurement was made by a method in accordance with JISZ8722.

The luminous transmittance can be determined from $Y=K\int S(\lambda)y(\lambda)T(\lambda)d\lambda$, where $S(\lambda)$: spectral distribution of the wavelength of 400 to 700 nm, $y(\lambda)$: color-matching function, $T(\lambda)$: spectral solid-angle transmittance, and Y: luminous transmittance.

(5) Transmissive Clarity

Using an image clarity meter "ICM-1DP" manufactured by Suga Test Instruments Co., Ltd, measurement was made by optical combs each measuring 2 mm in width, 1 mm, 0.5 mm, and 0.125 mm, and the measurement value in each width and the total were calculated.

(6) Glossiness (20-Degree, 60-Degree)

A black plastic tape (Nitto plastic tape, PROSELF No. 21 (wide)) was attached on the surface opposite to the coating and 20-degree and 60-degree glossiness was measured using a gloss meter (GM-3D) manufactured by Murakami Color Research Laboratory Co., Ltd.

(7) Pencil Hardness

Using HEIDON 14 manufactured by Shinto Scientific Co., Ltd., measurement was made in accordance with JIS K 5400.

(8) Glare

Each of the antiglare films was overlapped on a liquid crystal display (LCD) having resolution of 150 ppi in green on the whole surface, and the degree of occurrence of glare on the screen was visually evaluated. A clear type hard coat film on which glare is not generated was installed in advance on the LCD surface. Those with no or little glare were rated "Good", while those with large glare and deteriorated visibility were rated "Poor".

(9) White Blur, Whiteness

White blur caused by reflection of external light was measured as black density using a Macbeth densitometer by attaching a black plastic tape (Nitto plastic tape, PROSELF No. 21 (wide)) on the surface opposite to the coating. The value of 2.15 or more was rated "Good", the value at 2.10 or more and less than 2.15 was rated "Fair", and the value of less than 2.10 was rated "Poor". As for whitishness of the coating film by transmitted light, a state in which light is scattered in the film by internal haze and the coating film becomes whitish when the coated surface is located on the observer side and a white fluorescent lamp is seen through the antiglare hard coat film was visually evaluated. Those with no or little whitishness were rated "Good", those with slightly strong whitishness were rated "Fair", and whitish coating film was rated "Poor".

(10) Antiglare Properties

Ten straight lines drawn at intervals of 1 mm were allowed to appear on the coated face of an antiglare hard coat film. As for antiglare properties, a state in which a line width becomes blur due to light scattering and becomes hard to be seen when the coated surface is located on the observer side and the line width is seen through the antiglare hard coat film was visually evaluated. Those in which the line width cannot be recognized were rated "Good", while those in which the line width can be recognized were rated "Poor".

TABLE 1

|  | Maximum cross sectional height (μm) | Average inclination angle (degree) | Haze (%) | Luminous transmittance (Transmission Y value) | Glossiness 20° (%) | Glossiness 60° (%) | Pencil hardness | Glare | White blur | Whiteness | Antiglare properties |
|---|---|---|---|---|---|---|---|---|---|---|---|
| Example 1 | 1.62 | 0.4 | 0.5 | 92.15 | 70 | 88 | 2H | Good | Good | Good | Good |
| Example 2 | 1.75 | 0.4 | 0.7 | 92.16 | 72 | 90 | 2H | Good | Good | Good | Good |
| Example 3 | 1.72 | 0.3 | 0.5 | 92.19 | 69 | 95 | 2H | Good | Good | Good | Good |
| Example 4 | 2.41 | 0.7 | 1.2 | 92.21 | 75 | 94 | 3H | Good | Good | Good | Good |
| Example 5 | 2.12 | 0.9 | 2.6 | 92.02 | 50 | 77 | 2H | Good | Good | Fair | Good |
| Example 6 | 1.59 | 0.2 | 0.4 | 92.20 | 70 | 90 | 2H | Good | Good | Good | Good |
| Example 7 | 2.31 | 0.5 | 0.8 | 92.21 | 70 | 90 | 3H | Good | Good | Good | Good |
| Example 8 | 2.06 | 0.2 | 0.8 | 92.10 | 65 | 91 | 3H | Good | Good | Good | Good |
| Example 9 | 1.32 | 0.2 | 1.0 | 92.08 | 80 | 89 | 3H | Good | Good | Good | Good |
| Comparative Example 1 | 3.32 | 1.2 | 5.2 | 91.82 | 20 | 30 | 2H | Poor | Poor | Poor | Good |
| Comparative Example 2 | 0.12 | 0.2 | 0.4 | 91.78 | 92 | 96 | 3H | Good | Good | Good | Poor |
| Comparative Example 3 | 1.84 | 1.1 | 5.3 | 91.87 | 75 | 89 | 2H | Poor | Poor | Poor | Good |
| Comparative Example 4 | 0.05 | 0.0 | 0.2 | 92.10 | 98 | 98 | 3H | Good | Good | Good | Poor |
| Comparative Example 5 | 1.85 | 0.6 | 0.5 | 92.15 | 68 | 92 | 3H | Poor | Good | Good | Good |

TABLE 2

| | Transmissive clarity (%) Optical comb width (mm) | | | | |
|---|---|---|---|---|---|
| | 0.125 | 0.5 | 1.0 | 2.0 | Total |
| Example 1 | 71 | 83 | 84 | 95 | 333 |
| Example 2 | 73 | 82 | 85 | 96 | 336 |
| Example 3 | 71 | 84 | 86 | 93 | 334 |
| Example 4 | 75 | 82 | 92 | 97 | 346 |
| Example 5 | 73 | 77 | 80 | 89 | 319 |
| Example 6 | 72 | 78 | 90 | 96 | 336 |
| Example 7 | 75 | 82 | 90 | 95 | 342 |
| Example 8 | 70 | 77 | 90 | 97 | 325 |
| Example 9 | 71 | 83 | 93 | 97 | 325 |
| Comparative Example 1 | 10 | 15 | 20 | 25 | 70 |
| Comparative Example 2 | 78 | 83 | 85 | 95 | 341 |
| Comparative Example 3 | 35 | 52 | 71 | 81 | 239 |
| Comparative Example 4 | 97 | 97 | 97 | 97 | 388 |
| Comparative Example 5 | 28 | 54 | 90 | 96 | 268 |

As is apparent from the results in Tables 1 and 2 shown above, in all of Examples 1 to 9 having a maximum cross sectional height in the evaluation region of a surface of an antiglare hard coat film of 1.0 to 3.0 μm or less and an average inclination angle of 1 degree or less, an antiglare hard coat film having satisfactory image clarity, luminous transmittance, glossiness and surface strength (pencil hardness), as well as suppressed glare, white blur and whitishness was obtained.

For all of Examples 1 to 9, the average particle size of the fine particles, the refractive index difference from the resin, and the amount thereof used in the antiglare hard coat layer, the coating film thickness of the antiglare hard coat layer, and the haze value of the antiglare hard coat film are within the respective desired ranges of the present invention, and an antiglare hard coat film having satisfactory luminous transmittance, image clarity, glossiness and surface strength (pencil hardness), as well as suppressed glare, white blur and whitishness was obtained.

On the other hand, in any of Comparative Examples 1 and 2 in which though the fine particles are contained, the maximum cross sectional height in the evaluation region on the surface of the antiglare hard coat film is not within the range of 1.0 to 3.0 μm, an antiglare hard coat film having satisfactory luminous transmittance, image clarity and glossiness, as well as suppressed glare, white blur and whitishness could not be obtained. In Comparative Example 1 with a small coating film thickness, the haze increased and thus the image clarity, lowered glossiness, glare, white blur and whitishness drastically deteriorated.

In Comparative Example 2 with a large coating film thickness and Comparative Example 4 in which no fine particles were added, glossiness was high and no antiglare properties were obtained at all. In Comparative Example 5 in which the fine particles having particle size larger than that within the desired ranges of the present invention are used, though the maximum cross sectional height and the average inclination angle were within the ranges of the present invention, satisfactory image clarity of the present invention could not be obtained because of a low value of transmissive clarity.

The invention claimed is:

1. An antiglare hard coat film formed by providing an antiglare hard coat layer containing fine particles and a resin on a transparent film,
   wherein when an average value of height in an evaluation region on a surface of the antiglare hard coat film is set at zero (0), a maximum cross sectional height represented by a difference between a height maximum value in the evaluation region and a height minimum value in the evaluation region is from 1.0 to 3.0 μm, and an average inclination angle of unevenness on the surface of the antiglare hard coat film is 1 degree or less,
   wherein the total value of transmissive clarity measured through four optical combs (each measuring 2 mm in width, 1 mm, 0.5 mm, and 0.125 mm) using a transmissive clarity measuring device according to JIS K 7105-1981 is 280% or more, and the value of the transmissive clarity measured through each optical comb is 70% or more, respectively, wherein the fine particles have an average particle size of 1.0 to 4.8 µm,
wherein a haze value of the antiglare hard coat film is from 0.1 to 5.0%,
wherein 60-degree specular glossiness is 70% or more and 95% or less,
wherein 20-degree specular glossiness is 30% or more and 90% or less, and
wherein luminous transmittance (transmission Y value) is 92.00 or more.

2. The antiglare hard coat film according to claim 1, wherein a coating film thickness of the antiglare hard coat layer is 0.5 to 1.5 times larger than the average particle size of the fine particles.

3. The antiglare hard coat film according to claim 2, wherein the fine particles have an average particle size of 3.0 to 4.8 µm.

4. The antiglare hard coat film according to claim 2, wherein the amount of the fine particles mixed is from 0.05 to 3 parts by weight based on 100 parts by weight of the resin.

5. The antiglare hard coat film according to claim 2, wherein the resin contained in the antiglare hard coat layer is an ionizing radiation curable resin.

6. The antiglare hard coat film according to claim 2, wherein the transparent film is a triacetyl cellulose film, a polyethylene terephthalate film, or a norbornene film.

7. The antiglare hard coat film according to claim 1, wherein the fine particles have an average particle size of 3.0 to 4.8 µm.

8. The antiglare hard coat film according to claim 7, wherein the amount of the fine particles mixed is from 0.05 to 3 parts by weight based on 100 parts by weight of the resin.

9. The antiglare hard coat film according to claim 7, wherein the resin contained in the antiglare hard coat layer is an ionizing radiation curable resin.

10. The antiglare hard coat film according to claim 7, wherein the transparent film is a triacetyl cellulose film, a polyethylene terephthalate film, or a norbornene film.

11. The antiglare hard coat film according to claim 1, wherein the amount of the fine particles mixed is from 0.05 to 3 parts by weight based on 100 parts by weight of the resin.

12. The antiglare hard coat film according to claim 1, wherein the resin contained in the antiglare hard coat layer is an ionizing radiation curable resin.

13. The antiglare hard coat film according to claim 1, wherein the transparent film is a triacetyl cellulose film, a polyethylene terephthalate film, or a norbornene film.

* * * * *